United States Patent
Kothandaraman et al.

(10) Patent No.: US 6,710,640 B1
(45) Date of Patent: Mar. 23, 2004

(54) ACTIVE WELL-BIAS TRANSISTOR FOR PROGRAMMING A FUSE

(75) Inventors: Chandrasekharan Kothandaraman, Bogota, NJ (US); S. Sundar Kumar Iyer, Beacon, NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/247,154

(22) Filed: Sep. 19, 2002

(51) Int. Cl.⁷ .............................. H01H 37/76
(52) U.S. Cl. .................................... 327/525
(58) Field of Search ................. 327/403, 404, 327/524, 525, 526

(56) References Cited

U.S. PATENT DOCUMENTS 6,150,868 A * 11/2000 Kim et al. ............... 327/525
6,384,664 B1 * 5/2002 Hellums et al. ......... 327/525

* cited by examiner

*Primary Examiner*—Jeffrey Zweizig
(74) *Attorney, Agent, or Firm*—Jackson Walker L.L.P.

(57) ABSTRACT

A transistor (such as a MOSFET) is operated with the well biased, as opposed to being grounded, to program an electric fuse. With the programming transistor operated with an active well bias, more energy is enabled for programming the fuse than is available with a grounded well for the same size transistor. Thus, a smaller transistor can be used of programming the fuse. In a multiple fuse embodiment, the programming transistors can be arranged in the same "well" with a common independent Vbias applied, via a body control circuit, to the entire well during programming of a select fuse.

20 Claims, 3 Drawing Sheets

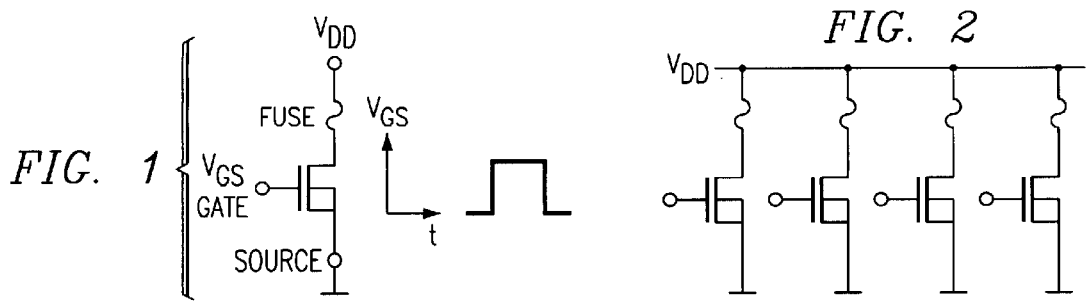
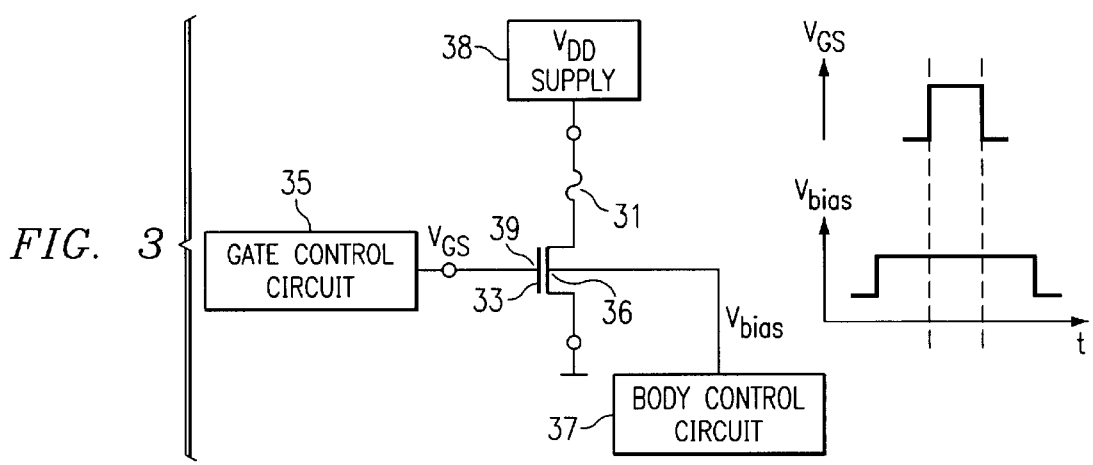
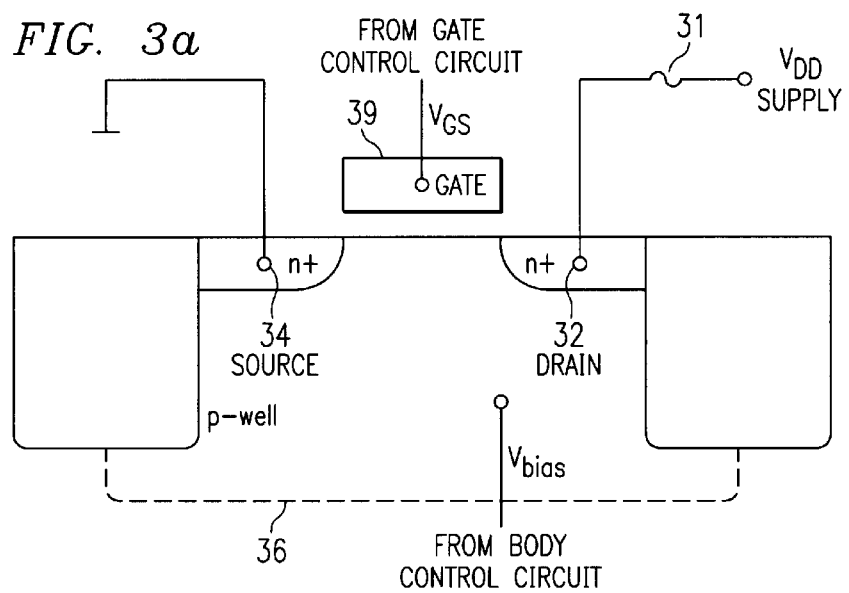

ACTIVE WELL-BIAS TRANSISTOR FOR PROGRAMMING A FUSE

BACKGROUND OF THE INVENTION

1. Technical Field of the Invention

The invention relates generally to the field of semiconductor devices and, more particularly, to electric fuse programming.

2. Description of Related Art

In integrated circuits including CMOS integrated circuits, it is often desirable to be able to permanently store information, or to form permanent connections of the integrated circuit after it is manufactured. Fuses or devices forming fusible links are frequently used for this purpose. For example, fuses can be programmed to replace defective elements with identical redundant elements. Further, fuses can be used to store die identification or other such information, or to adjust the speed of a circuit by adjusting the resistance of the current path.

A conventional circuit for programming a fuse is shown in FIG. 1 in which the fuse is connected between the drain of a programming transistor and a supply voltage $V_{DD}$. Initially, the resistance of the fuse is small (in the range of 100 ohms). The fuse is programmed by switching ON the programming transistor with a pulse applied to the gate. When the transistor is turned ON, the transistor starts to conduct and current flows through the fuse. The current flow causes the fuse to heated-up, and if sufficient current continues to flows through it, it will get programmed by melting, electrormigration or other mechanisms, resulting in a much higher resistance (i.e., programmed resistance).

The programming transistor must have the capacity to carry the current required to program the fuse. In order to achieve that capacity, the width of the programming transistor is appropriately chosen. For poly-silicide fuses, the peak current required for programming can be of the order of 10 mA or more. This order of current requires a wide programming transistor (in the range of 40 microns for a gate oxide thickness of 6.5 nm), hence the silicon area required for implementation can be significant even if the individual fuse element itself is small.

Exacerbating the problem is the fact that most integrated chips include multiple fuses such as the multiple fuse circuit shown in FIG. 2. In DRAM chips, for example, a few thousand fuses are generally used. The large size of individual programming transistors combined with the large number of transistors can be quite costly because of the silicon wafer area consumed. Hence, there is a need for an innovative approach for programming electrical fuses which results in wafer area reduction and/or increased programming current capability.

SUMMARY OF THE INVENTION

The present invention achieves technical advantages as an apparatus, system and method of programming an electrical fuse using a transistor with active well bias. With the programming transistor operated with an active well bias, more energy is enabled for programming the fuse than is available without biasing the well for the same size transistor. Thus, a smaller transistor can be used for programming the fuse. In a multiple fuse embodiment, the programming transistors can be arranged in the same "well" with a common independent Vbias applied, via a body control circuit, to the entire well during programming of a select fuse.

BRIEF DESCRIPTION OF THE DRAWINGS

For a more complete understanding of the present invention, reference is made to the following detailed description taken in conjunction with the accompanying drawings wherein:

FIG. 1 illustrates a conventional circuit for programming a fuse;

FIG. 2 illustrates a conventional circuit for programming multiple fuse;

FIG. 3 illustrates a circuit diagram of a fuse structure using a programming transistor with active well bias in accordance with an exemplary embodiment of the present invention;

FIG. 3A illustrates a fuse structure with a cross section view of an NFET transistor with active well bias for fuse programming in accordance with an exemplary embodiment of the present invention;

DETAILED DESCRIPTION

Figure 3B:
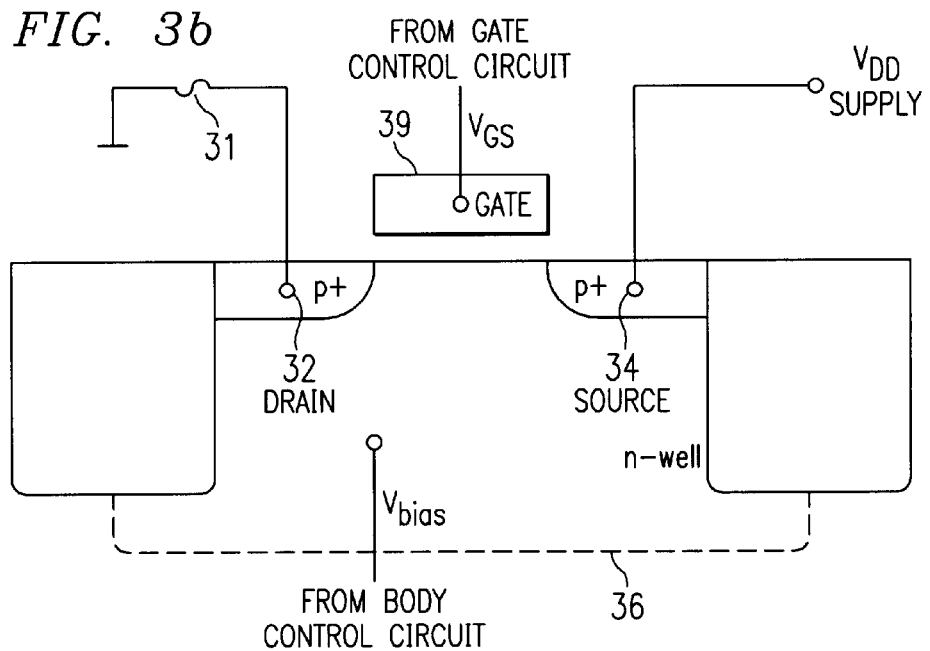
FIG. 3B illustrates a fuse structure with a cross section view of an pFET transistor with active well bias for fuse programming in accordance with an exemplary embodiment of the present invention.

The numerous innovative teachings of the present application will be described with particular reference to the presently preferred exemplary embodiments. However, it should be understood that this class of embodiments provides only a few examples of the many advantageous uses and innovative teachings herein. In general, statements made in the specification of the present application do not necessarily delimit any of the various claimed inventions. Moreover, some statements may apply to some inventive features, but not to others. Throughout the drawings, it is noted that the same reference numerals or letters will be used to designate like or equivalent elements having the same function. Detailed descriptions of known functions and constructions unnecessarily obscuring the subject matter of the present invention have been omitted for clarity.

Referring now to FIG. 3 there is illustrated a circuit diagram of an embodiment of the present invention in which an electrical fuse 31 is programmed using an nFET transistor 33 with an active well bias. With active well bias, a much higher programming energy is enabled as compared to transistors of the same size with the body grounded. Thus, a smaller transistor can be used for programming the same size fuse.

The body 36 of the transistor 33 is biased with Vbias independent of the supply voltage 38 and the gate control circuit 35 which operates to activate the gate 39. For programming the fuse 31, a programming voltage (VDD) is applied across the series coupled fuse 31 and transistor 33 of sufficient magnitude to operate the transistor 33 in its saturation region. The transistor body 36, which is grounded in typical approaches, is then turned high to Vbias by operation of a body control circuit 37. Cooperable with the body control circuit 37, the gate 39 is then turned on with a voltage pulse (VGS) for the duration of fuse programming. After the programming operation is complete, the body bias can be brought back to ground. In one embodiment, values for the body bias are greater than zero and less than approximately 0.7 volts. In one embodiment, the fuse 31, transistor 33, body control circuit 37 and gate control circuit are integrated on a silicon chip.

Referring now to FIG. 3A there is shown a schematic representation of cross-section of the nFET device in an integrated circuit connected to a fuse. In this embodiment, a first end of the fuse 31 is coupled to the transistor drain 32 and the second end is coupled to VDD supply, the transistor source 34 is coupled to ground. For programming, Vbias is provided to the body 36 for actively biasing the p-well of the NFET where Vbias is greater than zero volts.

Referring now to FIG. 3B there is shown a graphical representation of an exemplary embodiment of the present invention in which the programming transistor 33 is an pFET. In this embodiment, a first end of the fuse 31 is coupled to the transistor drain 32 and the second end is coupled to ground, the transistor source 34 is coupled to VDD supply. For programming, Vbias is provided to the body 36 for actively biasing the n-well of the pFET in which Vbias is less than the programming voltage VDD.

Figure 4:
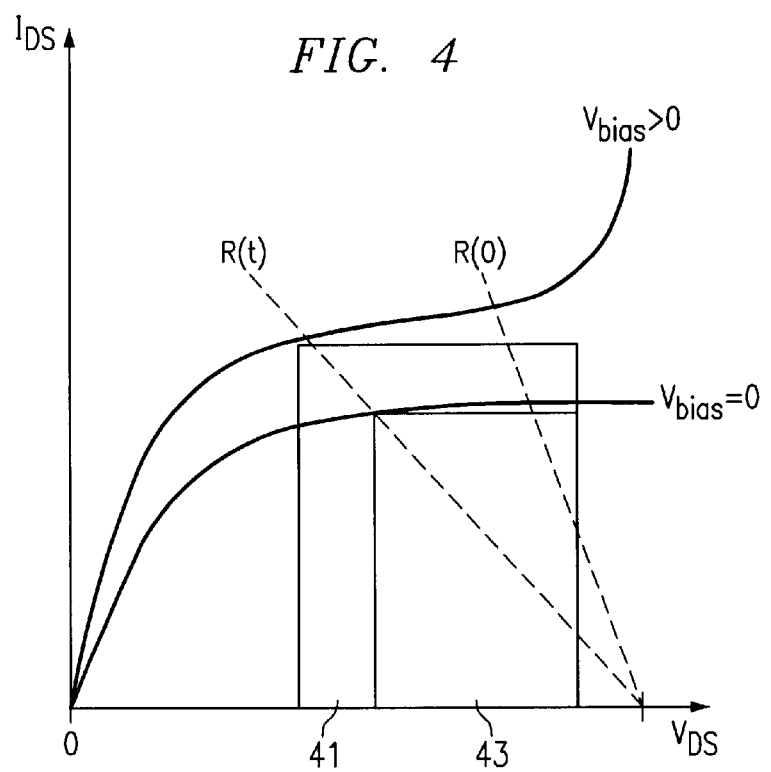
FIG. 4 show s a graphical representation of the operating characteristics of the programming transistor illustrated in FIG. 3 in accordance with an exemplary embodiment of the present invention.

Referring now to FIG. 4 there is shown a graphical representation of the operating characteristics of the programming transistor illustrated in FIG. 3 in accordance with an exemplary embodiment of the present invention. Here, the load-line of the fuse at two times, 0 and t, are shown as straight lines, R(0) and R(t). This change in the load line from time period 0 to t is due to the increase in the fuse resistance as the fuse gets heated-up during programming. This in combination with increasing Vbias results in increased energy coupled into the fuse. For example, a bias of approximately 0.6 volts enables an increase of as much as 30% over conventional approaches.

The effectiveness of fuse programming is dependent on the amount of energy that is coupled to the fuse during programming. The amount of power coupled into the fuse at time t for Vbias=0 is given by the area marked as item 43. The amount of power coupled into the fuse at time t for Vbias>0 is shown by the area marked as item 41 which includes the item 43 area. Thus, it can be seen that more energy is coupled to the fuse by operating the transistor with the body forward biased at any time t.

Figure 5:
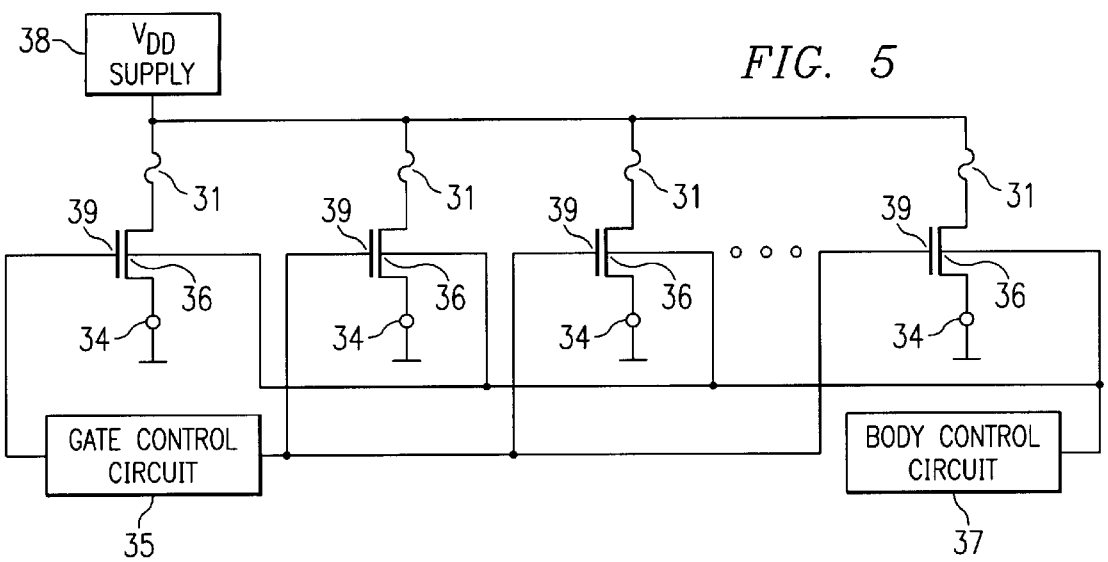
FIG. 5 illustrates a circuit diagram of a multiple fuse structure arrangement using active well bias in accordance with an exemplary embodiment of the present invention.

The present invention can also be used in multiple fuse arrangements. An exemplary multiple fuse arrangement is illustrated in FIG. 5. Here, the fuses 31 are coupled to the VDD supply 38 via a common node and the source 34 of each nFET is coupled to ground. Each gate 39 is coupled to a gate control circuit 35 and the bodies 36 are coupled to the body control circuit 37. For programming a select fuse, the programming voltage (VDD) is applied across the series coupled fuse 31 and nFET. The body 36, which is grounded in typical approaches, is then turned high to Vbias by operation of a body control circuit 37. Using suitable logic, the gate control circuit 35 turns on the gate 39 of the NFET associated with the select fuse with a voltage pulse (VGS) for the duration of the fuse programming. After the programming operation is complete, the body bias can be brought back to ground.

The nFET transistors can be arranged in the same "well" with a common independent Vbias applied to the entire well during the programming of the fuse. The maximum number of transistors that may be placed in single well for this embodiment depends on the maximum current leakage due the forward bias of the well that can be tolerate for a specific application. In addition, the bank of transistors can be placed in a triple well, which is available with current technology, offering for improved isolation from other circuits when programming using active well bias.

Figure 6:
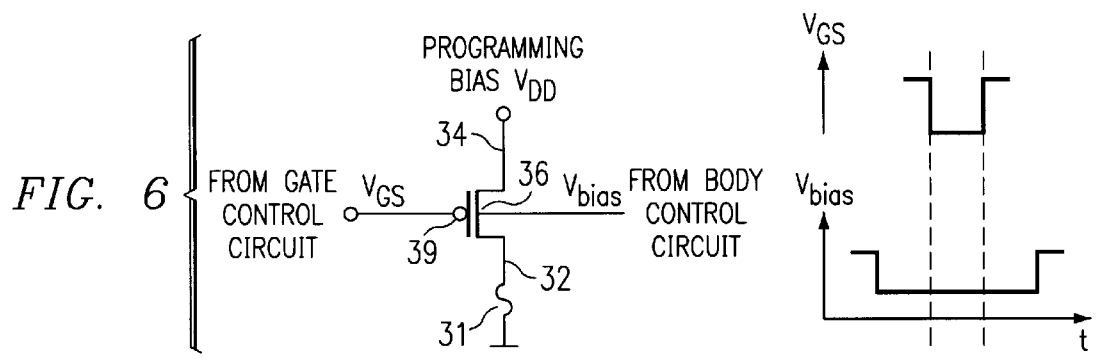
FIG. 6 illustrates a circuit diagram of a fuse structure using a programming transistor with active well bias in accordance with another exemplary embodiment of the present invention.

Although the preceding description focused on programming using nFETs, the presently described approach can be implemented using pFETs. FIG. 6 shows a circuit diagram of an embodiment of the present invention in which an electrical fuse 31 is programmed using an pFET using an active well bias. Here, the fuse 31 is coupled between the drain 32 and ground. In one embodiment, VDD−0.7 volts<Vbias<VDD. In a pFET for example, the source is held at the highest potential (VDD). Vbias is selected to prevent the p+ source-n-well junction diode from turning ON when forward well bias is provided. Otherwise the leakage is disadvantageously high.

Figure 7:
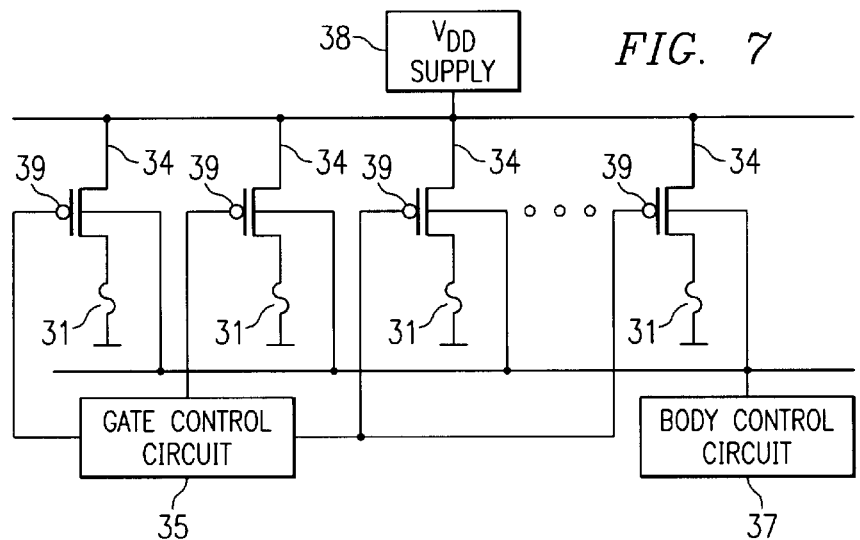
FIG. 7 illustrates a circuit diagram of a multiple fuse structure arrangement using active well bias in accordance with another exemplary embodiment of the present invention.

FIG. 7 shows a multiple fuse programming embodiment using the pFET arrangement shown in FIG. 6. As with the NFET transistors, the pFETs can be arranged in the same "well" with a common independent Vbias applied to the entire well during the programming of the fuse.

Although a preferred embodiment of the method and system of the present invention has been illustrated in the accompanied drawings and described in the foregoing Detailed Description, it is understood that the invention is not limited to the embodiments disclosed, but is capable of numerous rearrangements, modifications, and substitutions without departing from the spirit of the invention as set forth and defined by the following claims.

What is claimed is:

1. A programmable fuse apparatus, comprising:
    a programmable fuse structure including a fuse and a transistor having a gate and drain and source, said transistor coupled to said fuse such that said drain and said source are selectively connectable in series with said fuse; and
    a programming device coupled to said fuse structure and cooperable with said transistor for producing in said fuse a current of sufficient magnitude to produce an increase in electrical resistance in said fuse, said programming device adapted to operate said transistor with an active well bias.

2. The programmable fuse apparatus of claim 1, wherein said programming device includes a control circuit coupled to said gate and adapted to provide a signal of sufficient magnitude to activate said gate for commencing a programming period.

3. The programmable fuse apparatus of claim 1, wherein said programming device includes a control circuit coupled to the well of said transistor and adapted to provide a signal of sufficient magnitude to forward bias the well during programming.

4. The programmable fuse apparatus of claim 1, wherein said programming device comprises:
    a first control circuit coupled to said gate and adapted to provide a signal of sufficient magnitude to activate said gate for commencing a programming period; and
    a second control circuit coupled to the well of said transistor and adapted to provide a signal of sufficient magnitude to forward bias the well during said programming period.

5. The programmable fuse apparatus of claim 1, wherein said transistor is a pFET.

6. The programmable fuse apparatus of claim 1, wherein said fuse structure and said programming device are integrated on a silicon chip.

7. The programmable fuse apparatus of claim 1 further including a power supply coupled to said fuse structure and adapted to provide voltage of sufficient magnitude to operate said transistor in its saturation region.

8. The programmable fuse apparatus of claim 7, wherein said power supply is further adapted to provide said current responsive to activation of said transistor gate.

9. An electrical programming system, comprising:
a plurality of programmable fuse structures coupled at a common node each including a fuse and a transistor having a gate and drain and source, said transistor coupled to said fuse such that said drain and said source are connectable in series with said fuse; and
a programming device coupled to each of said fuse structures and adapted to effectuate a current of sufficient magnitude to produce an increase in electrical resistance selectively to one of the fuses of said fuse structures, said programming device further adapted to operate said transistors with an active well bias.

10. The electrical programming system of claim 9, wherein said programming device includes a control circuit coupled to each well of said transistor and adapted to provide a signal of sufficient magnitude to forward bias the transistor wells during programming.

11. The electrical programming system of claim 10, wherein said transistors are provided in a common well such that applying said signal to said common well forward biases all transistor wells.

12. The electrical programming system of claim 9, wherein said programming device includes a control circuit coupled to said gates and adapted to effectuate selection of the fuse, said control circuit further adapted to provide a signal of sufficient magnitude to activate the gate of the transistor associated with the fuse for commencing a programming period.

13. The electrical programming system of claim 9, wherein said programming device comprises:
a first control circuit coupled to said gates and adapted to effectuate selection of the fuse, said control circuit further adapted to provide a signal of sufficient magnitude to activate the gate of the transistor associated with the fuse for commencing a programming period; and a second control circuit coupled to each well of said transistor and adapted to provide a signal of sufficient magnitude to forward bias the transistor wells during said programming period.

14. The electrical programming system of claim 9, wherein said transistors are pFETs.

15. The electrical programming system of claim 9 further including a power supply coupled to said fuse structures and adapted to provide voltage of sufficient magnitude to operate said transistors in their saturation region, said power supply is further adapted to provide said current responsive to activation of said transistor gates.

16. A method of programming an integrated electric fuse via a series coupled transistor having a drain, source and gate, wherein said fuse is coupled to one of said drain and source, said method comprising:
producing in said fuse a current of sufficient magnitude to produce an increase in electrical resistance in said fuse, including operating said transistor with an active well bias; and
performing said producing step during a programming period, and applying a signal to said transistor gate of sufficient magnitude to activate said transistor for commencing the programming period.

17. The method of claim 16, wherein operating said transistor with an active well bias includes applying a voltage signal to the well of said transistor of sufficient magnitude to forward bias the well during the programming period.

18. The method of claim 16 further including applying a programming voltage to said series coupled transistor and said fuse of sufficient magnitude to operate said transistor in its saturation region.

19. The method of claim 16 further including selecting said fuse from a plurality of available fuses coupled at a common node for producing said current in said fuse, each of said plurality of available fuses having an associated transistor, and applying a voltage signal to the well of said transistor of sufficient magnitude to forward bias the well during the programming period.

20. The method of claim 19, further including providing said transistors in a common well such that applying said voltage signal to the common well biases each well of said transistors.

* * * * *